United States Patent [19]
Kawasaki

[11] Patent Number: 5,289,502
[45] Date of Patent: Feb. 22, 1994

[54] SIGNAL PROCESSING DEVICE

[75] Inventor: Somei Kawasaki, Tokyo, Japan

[73] Assignee: Canon Kabushiki Kaisha, Tokyo, Japan

[21] Appl. No.: 785,278

[22] Filed: Oct. 30, 1991

[30] Foreign Application Priority Data

Nov. 2, 1990 [JP] Japan .................. 2-297614

[51] Int. Cl.⁵ .................. H03C 3/00; H03K 7/06; H04L 27/12
[52] U.S. Cl. .................. 375/62; 332/123; 332/126; 455/205; 329/319
[58] Field of Search .................. 375/62; 332/100, 117, 332/118, 123, 124, 126; 455/205, 210, 214; 329/315, 318, 319

[56] References Cited

U.S. PATENT DOCUMENTS

| | | |
|---|---|---|
| 3,737,585 | 6/1973 | Ghosh .................. 375/4 |
| 4,359,779 | 11/1982 | Levine .................. 332/123 |
| 4,503,405 | 3/1985 | Jordan et al. .................. 332/123 |
| 4,600,943 | 7/1986 | Tanabe .................. 375/118 X |
| 4,628,286 | 12/1986 | Nossen .................. 332/100 |
| 4,839,615 | 6/1989 | Sato .................. 332/117 |
| 5,091,705 | 2/1992 | Hiramatsu et al. .................. 375/62 |
| 5,126,699 | 6/1992 | Kabler .................. 332/124 |

Primary Examiner—Curtis Kuntz
Assistant Examiner—Bryan Webster
Attorney, Agent, or Firm—Robin, Blecker, Daley & Driscoll

[57] ABSTRACT

A signal processing device for processing an information signal, comprises a frequency modulator arranged to receive the information signal, to frequency-modulate the received information signal and to output a frequency-modulated information signal, a feedback signal generator arranged to receive the frequency-modulated information signal output from the frequency modulator means and to generate a feedback signal therefrom at a phase which is variable to be either in-phase or out-of-phase relative to the received frequency-modulated information signal in accordance with a duty in a high-level period of the received frequency-modulated information signal and at an amplitude which is variable within a range from a zero level to the same level as the received frequency-modulated information signal, and addition circuitry arranged to add the feedback signal output from the feedback signal generator to the information signal received by the frequency modulator.

3 Claims, 3 Drawing Sheets

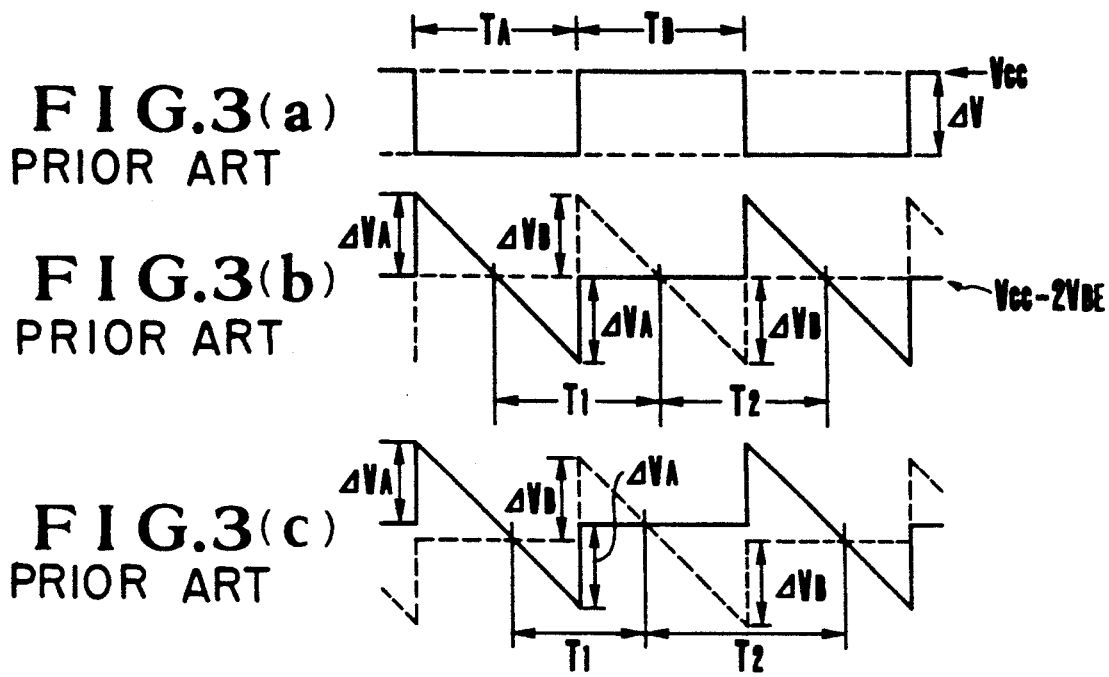
FIG.3(a) PRIOR ART
FIG.3(b) PRIOR ART
FIG.3(c) PRIOR ART
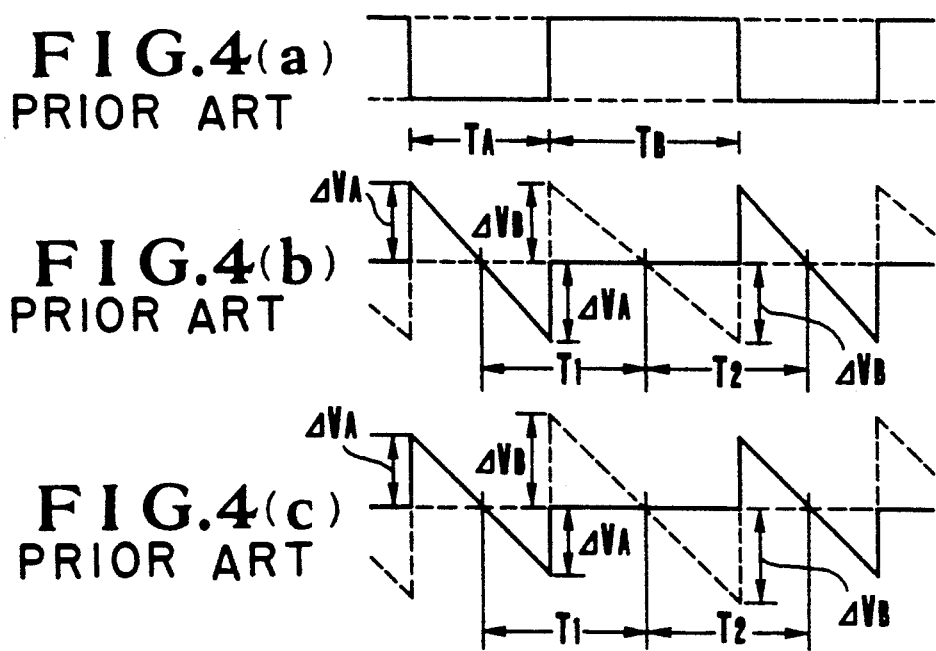
FIG.4(a) PRIOR ART
FIG.4(b) PRIOR ART
FIG.4(c) PRIOR ART

FIG.5
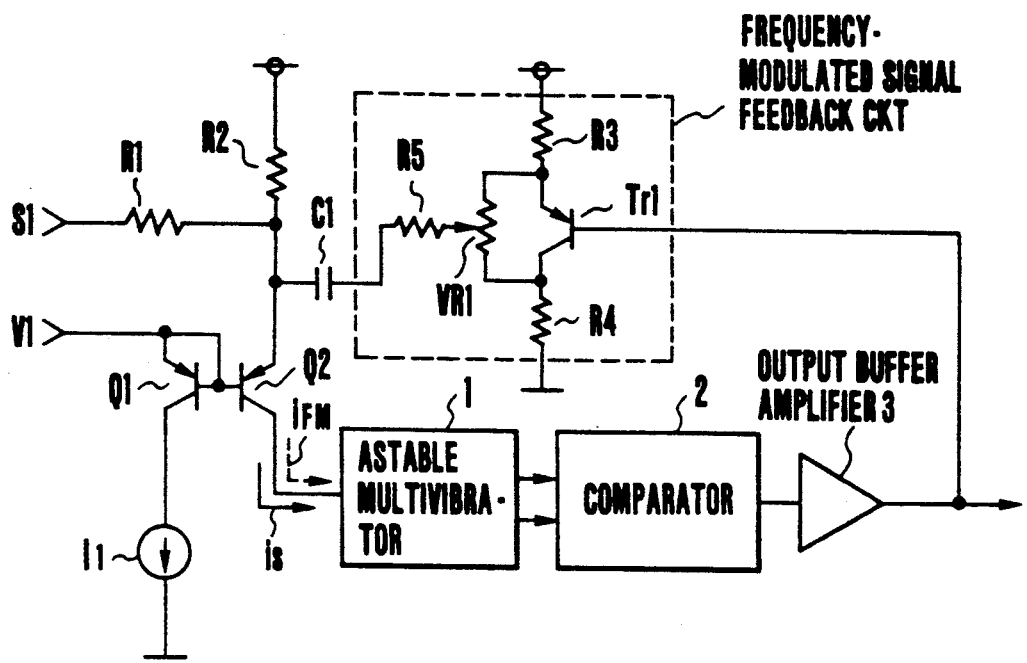
FIG.6(a)
FIG.6(b)
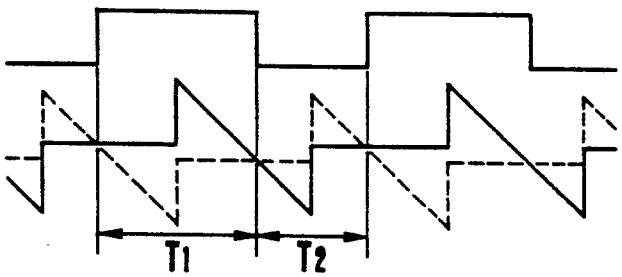
FIG.6(c)
FIG.6(d)
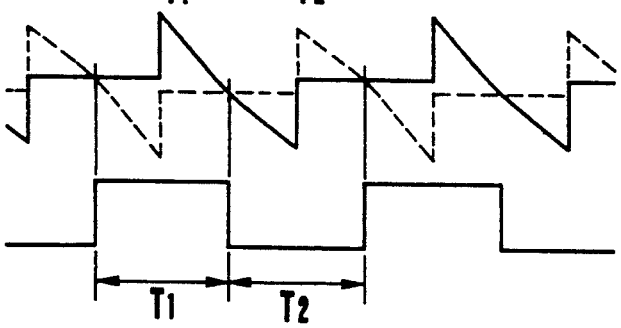

SIGNAL PROCESSING DEVICE

BACKGROUND OF THE INVENTION

1. Field of the Invention

This invention relates to a signal processing device for processing an information signal.

2. Description of the Related Art

Known information signal processing devices include an image signal recording and reproducing system, which is arranged, for example, to frequency-modulate an image signal, to record the frequency-modulated image signal on a recording medium, to reproduce the recorded image signal from the recording medium, and to frequency-demodulate the reproduced image signal to bring it back to its original state.

FIG. 1 shows in outline the arrangement of a frequency modulator employed for the image signal recording and reproducing system mentioned above.

Referring to FIG. 1, the illustration includes an astable multivibrator 1 which is arranged to vary its oscillation frequency in proportion to an input current signal "is"; a comparator 2 which is arranged to shape the waveform of a signal outputted from the astable multivibrator 1; and an output buffer amplifier 3.

Referring further to FIG. 1, a luminance signal which has been subjected to a preemphasizing process through a preemphasis circuit (not shown) is inputted to an input terminal S1. To another input terminal V1 is inputted a DC voltage signal which is at the same potential as that of a sync tip part of the luminance signal inputted to the input terminal S1. The oscillation frequency of the astable multivibrator 1 at the sync tip part of the luminance signal is set by means of a resistor R2. An amount of frequency deviation in the oscillation frequency is arranged to be set by means of another resistor R1.

FIG. 2 shows in detail the circuit arrangement of the astable multivibrator 1 shown in FIG. 1. The operation of the circuit of FIG. 2 is described below with reference to timing charts which are shown in FIGS. 3(a) to 3(c) and 4(a) to 4(c).

In FIG. 3(a), a signal waveform shown with a full line represents a waveform obtained at the collector of a transistor Q9, while another signal waveform shown with a broken line represents a waveform obtained at the collector of a transistor Q10. In FIG. 3(b), a signal waveform shown with a full line represents a waveform obtained at the emitter of a transistor Q7, while a signal waveform shown with a broken line represents a waveform obtained at the emitter of a transistor Q8.

Let us assume that the characteristic of the transistor Q9 coincides with that of the transistor Q10. The characteristic of a transistor Q5 coincides with that of a transistor Q6. The characteristic of the transistor Q7 coincides with that of the transistor Q8. The characteristic of a transistor Q11 coincides with that of a transistor Q12. The characteristic of a transistor Q13 coincides with that of a transistor Q14. The characteristic of a resistor r1 coincides with that of a resistor r2. Let us further assume that the beta ($\beta$) of each of these transistors which is IC/IB (wherein IC represents a collector current and IB a base current) is sufficiently large. Then, there are obtained the following relations:

$$\Delta VA = r1 \cdot I2, \quad (1)$$
$$\Delta VB = r2 \cdot I2 \quad (2)$$
$$\therefore \Delta VA = \Delta VB = \Delta V$$

-continued $$TA = \frac{2\Delta V \cdot C2}{iSA}, \quad (3)$$

$$TB = \frac{2\Delta V \cdot C2}{iSB} \quad (4)$$

$$iSA = iSB \quad (5)$$
$$\therefore TA = TB$$

Further, when signals outputed from the emitters of transistors Q15 and Q16 are supplied to the comparator 2 of FIG. 1, with the characersitics of the transistors Q15 and Q16 assumed to coincide with each other, the periods T1 and T2 of waveform-shaped signals outputted to the output buffer amplifier 3 of FIG. 1 become equal to each other. As a result, a frequency-modulated luminance signal is outputted with a stable duty.

However, an error $\Delta$VBE of about ±2 mV arises between paired transistors in a voltage VBE between the base and the emitter in general. Further, an error of about ±2% arises between the paired resistors. As a result, the waveform of the frequency-modulated luminance signal changes in a manner as shown in FIGS. 4(a) to 4(c).

FIG. 4(b) shows the waveform of the frequency-modulated luminance signal obtained in the event of a discrepancy between the transistors Q5 and Q6 in the characteristic of the voltage VBE between the base and the emitter. In this instance, the period TA is not equal to the period TB because iSA is not equal to iSB. However, the signal periods T1 and T2 remain equal to each other.

Meanwhile, FIG. 4(c) shows the waveform of the frequency-modulated luminance signal obtained in the event of a discrepancy in the characteristic of the base-emitter voltage between the transistors Q9 and Q10 and also a discrepancy in the characteristic of the resistance valve between the resistors r1 and r2. In that instance, TA$\neq$TB because $\Delta$VA$\neq\Delta$VB. However, the relation of T1=T2 remains unchanged.

Meanwhile, a system like a video tape recorder or an electronic still video system is arranged to frequency-multiplex a chrominance component signal in a lower frequency band than the frequency band of the frequency-modulated luminance signal in recording and reproducing an image signal. In reproducing the signal with the system of this kind, the secondary distortion component of the frequency-modulated luminance signal causes a cross modulation component FY+FC (wherein FY represents the carrier frequency of the luminance signal and FC represents the carrier frequency of the chrominance component signal) to appear within the reproduced signal. To avoid the generation of the cross modulation component, the secondary distortion component of the frequency-modulated luminance signal must be minimized, for example, by suppressing it to such a value as $-45$ dB. Therefore, the signals outputted from the emitters of the transistors Q15 and Q16 of the astable multivibrator shown in FIG. 2 are arranged to be supplied to the comparator 2 shown in FIG. 1.

However, if the voltage VBE between the base and the emitter of each of the paired transistors deviates from that of the other between the transistors Q13 and Q14, between transistors Q7 and Q8 or between transistors Q15 and Q16 and if an error $\Delta$VBE is generated between the transistors paired for the inputs of the comparator 2, a DC level obtained at a level comparison point varies to cause the state of T1≠T2 as shown in FIG. 3(c).

For example, if the voltages ΔVA and ΔVB are 500 mV and the error ΔVBE between the paired transistors is ±2 mV, the duty $\left( = \frac{T1}{T1 + T2} \right)$ becomes 50% ±

$$1.6 \left( = \frac{2 \text{ mV} \times 4}{500 \text{ mV} \times 2} \times 2 \right)\%.$$

In this instance, the relation of the duty to the secondary distortion component of the frequency-modulated luminance signal is as follows: the secondary distortion is about −26 dB when the duty is 50±1.6%; about −30 dB when the duty is 50±1.0%; and about −35 dB when the duty is 50±0.55%. Then, it is impossible to reduce the secondary distortion component of the frequency-modulated luminance signal, even if the error ΔVBE is lessened by increasing the size of the transistor.

In a conceivable method for solving the problem, a capacitor is attached to the outside of the output buffer amplifier 3 and the slew rate between the capacitor and a power supply is utilized. However, the effect of this method is attainable only when the duty is below 50% if the transistor to be used is of the NPN type and only when the duty is above 50% if the transistor is of the PNP type. Therefore, this method is hardly acceptable.

In another conceivable method, a frequency band of the frequency-modulated luminance signal of the secondary harmonic system is lessened by means of a trap, a low-pass filter or the like. However, that method deprives the system of interchangeability between recording and reproduction in respect to the frequency characteristic and room for inversion.

SUMMARY OF THE INVENTION

It is a general object of this invention to provide a signal processing device which is capable of solving the above-stated problems.

It is a more specific object of the invention to provide a signal processing device which is capable of stably frequency-modulating an information signal without deteriorating the information signal when carrying out a frequency-modulating action on the information signal.

Under this object, a signal processing device which is arranged to process an information signal in accordance with this invention as an embodiment thereof comprises frequency modulation means arranged to receive the information signal, to frequency-modulate the received information signal and to output a frequency-modulated information signal; correction signal forming means for forming a correction signal according to the frequency-modulated information signal outputted from the frequency modulation means and for outputting the correction signal; and correction means for correcting the information signal to be received by the frequency modulation means, by using the correction signal outputted from the correction signal forming means.

It is another object of the invention to provide a signal processing device which is arranged to stabilize the duty in frequency-modulating an information signal and to be capable of lessening the secondary distortion component of the information signal.

Under that object, a signal processing device which is arranged to process an information signal in accordance with this invention as another embodiment thereof comprises a frequency modulation circuit arranged to receive the information signal, to frequency-modulate the received information signal and to output a frequency-modulated information signal; a feedback signal forming circuit arranged to receive the frequency-modulated information signal outputted from the frequency modulation circuit and to form and output a feedback signal at a phase which is variable to be either inphase or to be antiphase relative to the received frequency-modulated information signal and at an amplitude which is variable within a range from a zero level to the same level as the information signal; and an addition circuit arranged to add the feedback signal outputted from the feedback signal forming circuit to the information signal to be received by the frequency modulation circuit.

These and other objects and features of this invention will become apparent from the following detailed description of an embodiment thereof taken in conjunction with the accompanying drawings.

BRIEF DESCRIPTION OF THE DRAWINGS

FIGS. 3(a) to 3(c) and 4(a) to 4(c) show in timing charts the operation of the frequency modulator of FIG. 1. FIG. 5 is a circuit diagram showing the circuit arrangement of a frequency modulator which is arranged according to this invention as an embodiment thereof. FIGS. 6(a) to 6(d) show in a timing chart the operation of the frequency modulator shown in FIG. 5.

DETAILED DESCRIPTION OF THE PREFERRED EMBODIMENT

Figure 1:
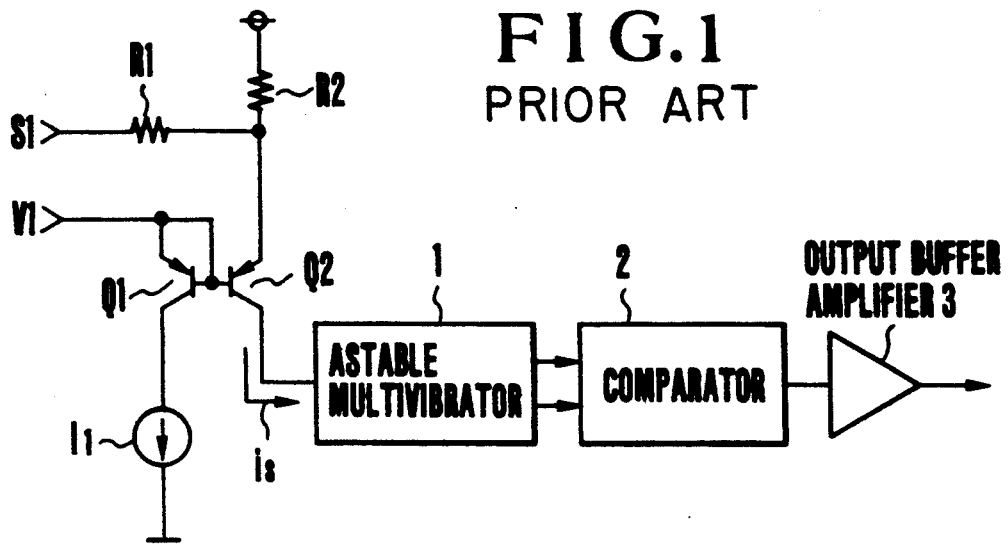
FIG. 1 is a circuit diagram showing the circuit arrangement of the conventional frequency modulator.
Figure 2:
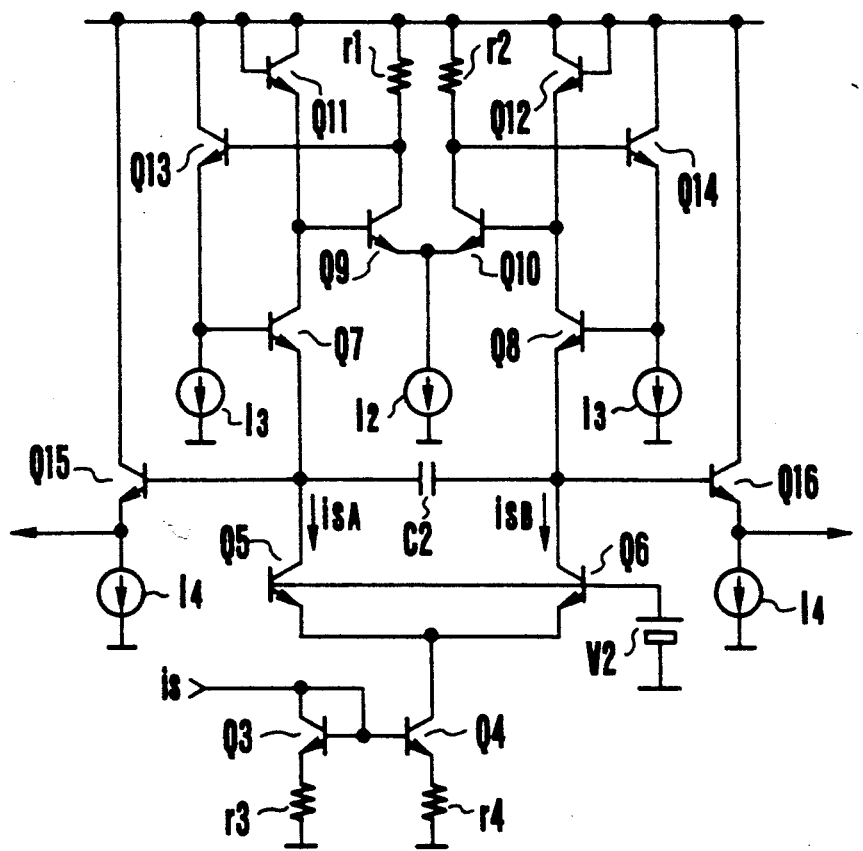
FIG. 2 is a circuit diagram showing the circuit arrangement of an astable multivibrator included in the frequency modulator of FIG. 1.

The following describes the details of this invention through an embodiment thereof:

FIG. 5 shows in outline the arrangement of a frequency modulator which is arranged as an embodiment of the invention. In FIG. 5, the same component parts as those of the conventional frequency modulator shown in FIG. 1 are indicated by the same reference numerals.

The operation of the frequency modulator shown in FIG. 5 is described below with reference also to FIGS. 6(a) to 6(d) which show in a timing chart the operation of the frequency modulator.

Referring to FIG. 5, a frequency-modulated luminance signal which is outputted from an output buffer amplifier 3 is inputted to a frequency-modulated signal feedback circuit which is composed of a transistor Tr1, resistors R3 to R5 and a variable resistor VR1.

The variable resistor VR1 which is disposed within the frequency-modulated signal feedback circuit outputs a feedback signal. The phase of the feedback signal outputted from the variable resistor VR1 is variable either to be in-phase or out-of-phase relative to the frequency-modulated luminance signal outputted from the above-stated output buffer amplifier 3. The amplitude of the feedback signal outputted from the variable resistor VR1 is variable within a range from a zero level to about the same level as the level of the frequency-modulated luminance signal outputted from the output buffer amplifier 3.

Further, a capacitor C1 shown in FIG. 5 is arranged to remove the DC component of the feedback signal outputted from the frequency-modulated signal feedback circuit so as to prevent the oscillation frequency of the frequency modulator from being affected by the feedback signal outputted from the frequency-modulated signal feedback circuit.

For example, in a case where the high-level period of the signal outputted from the output buffer amplifier 3 shown in FIG. 5 exceeds 50% in terms of the duty, as shown in FIGS. 6(a) and 6(b), the variable resistor VR1 outputs at a suitable level a signal which is in-phase with the signal outputted from the output buffer amplifier 3. The signal thus outputted from the variable resistor VR1 is inputted via the capacitor C1 to the frequency modulator as a frequency-modulated feedback signal. In this instance, a current obtained by discharging the electric charge of a capacitor C2 which is disposed within the astable multivibrator 1 becomes "is+iFM1" during the high-level period of the output of the output buffer amplifier 3. Then, the slope of the discharge becomes steep to shorten the period T1 of the output of the output buffer amplifier 3 as shown in FIGS. 6(c) and 6(d). During the low-level period of the output of the output buffer amplifier 3, the slope of discharge becomes moderate to lengthen the period T2. These periods T1 and T2, therefore, can be made to coincide with each other. Further, since the DC component is removed by the capacitor C1, a period of "T1+T2" remains unchanged.

Further, in a case where the high-level period of the signal outputted from the output buffer amplifier 3 is shorter than the low-level period of the same signal, a signal which is out-of-phase relative to the signal outputted from the output buffer amplifier 3 is outputted at a suitable level from the variable resistor VR1. By this, the period T1 can be made to coincide with the period T2 in the same manner as described in the foregoing.

Next, the above-stated correcting action is discussed below in terms of the frequency characteristic:

Assuming that a signal current required for oscillating a signal of a frequency f0 is "is(f0)" and the duty $$\left( = \frac{T1}{T1 + T2} \right)$$

for the high-level period of the frequency-modulated luminance signal before correction is D%, a feedback frequency-modulated signal current "iFM" can be expressed as follows:

$$is(f0) + iFM = D/50 \cdot is(f0) \therefore iFM = \{(D/50) - 1\} \cdot is(f0) \quad (7)$$

Then, a duty Df1 for causing oscillation at a frequency f1 can be expressed as follows:

$$Df1 \approx D \cdot \frac{\frac{f1}{f0} \cdot is(f0)}{\frac{f1}{f0} \cdot is(f0) + iFM} \quad (8)$$

This is because the duty before correction is independent of variations in frequency and the signal current is proportional to the oscillation frequency.

Next, when the frequency modulator of FIG. 5 is applied to an electronic still video system, the frequency modulator operates as described below:

In the frequency-modulated luminance signal handled by the electronic still video system, the carrier frequency of the sync tip part of the signal is 7.7 MHz. The frequency of the white peak part of the signal is 9.7 MHz, the frequency obtained when the amplitude level of the signal is 50% is 9.0 MHz. The frequency of a pedestal level of the signal is 8.3 MHz. Assuming that the duty before correction is 51.6% and the correcting action is performed at the amplitude level of 50%, the duty and the secondary distortion component at each of the above-stated levels of the frequency-modulated luminance signal are computed to obtain the following results: the duty is about 50.11% and the secondary distortion component is −49.2 dB at the white peak part. The duty is about 49.87% and the secondary distortion component is −47.8 dB at the pedestal level. The duty is about 49.74% and the secondary distortion component is −41.7 dB at the sync tip level part. The duty is thus stabilized while the generation of the secondary distortion component is reduced. Even in a case where the component elements of the circuit lack uniformity in characteristic, the duty can be corrected without increasing the secondary distortion component.

As described above, the signal processing device according to this invention is capable of stabilizing the duty and reducing the generation of the secondary distortion component when frequency-modulating the information signal.

What is claimed is:

1. A signal processing device for processing an information signal, comprising:
   a) frequency modulation means arranged to receive the information signal, to frequency-modulate the received information signal and to output a frequency-modulated information signal;
   b) feedback signal generating means arranged to receive the frequency-modulated information signal output from said frequency modulation means and to generate a feedback signal therefrom at a phase which is variable to be either in-phase or out-of-phase relative to the received frequency-modulated information signal in accordance with a duty in a high-level period of the received frequency-modulated information signal and at an amplitude which is variable within a range from a zero level to the same level as the received frequency-modulated information signal; and
   c) addition means arranged to add the feedback signal output from said feedback signal generating means to the information signal received by said frequency modulation means.

2. A device according to claim 1, wherein said feedback signal generating means is arranged to output the feedback signal in a state of being in-phase with the frequency-modulated information signal received from said frequency modulation means in a case where a duty of a high-level period of of the frequency-modulated information signal received from said frequency modulation means is greater than 50%.

3. A device according to claim 1, wherein said feedback signal generating means is arranged to output the feedback signal in a state of being out-of-phase relative to the frequency-modulated information signal received from said frequency modulation means in a case where a duty of a high-level period of the frequency-modulated information signal received from said frequency modulation means is less than 50%.

* * * * *